United States Patent
Guo et al.

(10) Patent No.: US 7,746,647 B2
(45) Date of Patent: Jun. 29, 2010

(54) CLIP AND HEAT DISSIPATION ASSEMBLY USING THE SAME

(75) Inventors: Qing-Lei Guo, Shenzhen (CN); Shou-Li Zhu, Shenzhen (CN); Ming Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 250 days.

(21) Appl. No.: 11/959,319

(22) Filed: Dec. 18, 2007

(65) Prior Publication Data
US 2009/0154108 A1 Jun. 18, 2009

(51) Int. Cl.
*H05K 7/20* (2006.01)
*H01L 23/34* (2006.01)
*F28F 7/00* (2006.01)

(52) U.S. Cl. ............... 361/710; 361/719; 361/709; 257/727; 165/80.3; 165/185

(58) Field of Classification Search ........... 361/709, 361/719, 710; 257/727; 165/80.3, 185
See application file for complete search history.

(56) References Cited

U.S. PATENT DOCUMENTS

| | | | | |
|---|---|---|---|---|
| 5,323,845 A * | 6/1994 | Kin-shon | ............. | 165/80.3 |
| 5,448,449 A * | 9/1995 | Bright et al. | ............. | 361/704 |
| 5,600,540 A * | 2/1997 | Blomquist | ............. | 361/704 |
| 5,640,305 A | 6/1997 | Smithers | | |
| 5,671,118 A * | 9/1997 | Blomquist | ............. | 361/704 |
| 5,933,326 A * | 8/1999 | Lee et al. | ............. | 361/704 |
| 5,953,212 A * | 9/1999 | Lee | ............. | 361/709 |
| 6,229,705 B1 | 5/2001 | Lee | | |
| 6,414,846 B1 * | 7/2002 | Chen | ............. | 361/704 |
| 6,418,022 B1 * | 7/2002 | Chen | ............. | 361/704 |
| 6,717,814 B2 * | 4/2004 | Li | ............. | 361/704 |
| 6,775,138 B2 * | 8/2004 | Lee et al. | ............. | 361/697 |
| 6,778,395 B1 * | 8/2004 | Dong et al. | ............. | 361/704 |
| 6,785,136 B2 * | 8/2004 | Chang et al. | ............. | 361/704 |
| 6,788,538 B1 * | 9/2004 | Gibbs et al. | ............. | 361/704 |
| 7,167,369 B1 * | 1/2007 | Huynh et al. | ............. | 361/719 |
| 7,180,746 B2 * | 2/2007 | Yu et al. | ............. | 361/719 |
| 7,215,550 B1 * | 5/2007 | Yang et al. | ............. | 361/704 |
| 7,236,369 B2 * | 6/2007 | Barina et al. | ............. | 361/719 |
| 7,283,361 B2 * | 10/2007 | Lee et al. | ............. | 361/704 |
| 7,283,367 B2 * | 10/2007 | Yu et al. | ............. | 361/719 |

(Continued)

*Primary Examiner*—Jayprakash N Gandhi
*Assistant Examiner*—Bradley H Thomas
(74) *Attorney, Agent, or Firm*—Jeffrey T. Knapp

(57) ABSTRACT

A clip (50) for securing a heat dissipating device to a heat source comprises a spring arm (510) and an ear (530). The spring arm comprises two wires (512) substantially parallel to each other, a hook (514) formed at one end of the spring arm to connect ends of the wires and two barbs (516) each formed at another end of each of the wires. A central portion of each of the wires projects downwardly. The ear comprises a main body (530*a*), two notches (532) in an upside of the main body and a clamping unit (537) at a downside of the main body. Each of the notches comprises from above to below an insertion slot (5321), an elongated sliding slot (5323) and a retaining slot (5325). The spring arm engages with the ear with the barbs extending into the insertion slots, and the wires are slideable downwardly along the sliding slots to be fixed in the retaining slots.

17 Claims, 5 Drawing Sheets

U.S. PATENT DOCUMENTS

| | | | |
|---|---|---|---|
| 7,286,362 B2 * | 10/2007 | Yu et al. | 361/704 |
| 7,375,965 B2 * | 5/2008 | Xia et al. | 361/704 |
| 7,515,419 B2 * | 4/2009 | Li et al. | 361/704 |
| 2001/0002160 A1 * | 5/2001 | Bookhardt et al. | 361/704 |
| 2004/0001315 A1 * | 1/2004 | Li | 361/697 |
| 2004/0179340 A1 * | 9/2004 | Lin | 361/704 |
| 2005/0066487 A1 * | 3/2005 | Zhang | 24/457 |
| 2005/0174739 A1 * | 8/2005 | Chen et al. | 361/704 |
| 2006/0133038 A1 * | 6/2006 | Yu et al. | 361/697 |
| 2007/0127214 A1 * | 6/2007 | Chen | 361/709 |
| 2008/0144289 A1 * | 6/2008 | Desrosiers et al. | 361/719 |

* cited by examiner

CLIP AND HEAT DISSIPATION ASSEMBLY USING THE SAME

BACKGROUND OF THE INVENTION

1. Field of the Invention

The present invention generally relates to fastening devices, and more particularly to a clip and a heat dissipation assembly using the clip.

2. Description of Related Art

Electronic components, such as integrated circuit packages, can generate large amounts of heat when operating. Unless removed in time, accumulated heat may reduce the operational efficiency of the electronic component. Nowadays, most electronic components are provided with a heat sink to disperse heat from the component in order to prevent the accumulation of heat. A clip is provided to firmly attach the heat sink to the electronic component. U.S. Pat. No. 6,229,705 B1 discloses a typical clip for securing a heat sink. The clip comprises a flake-shaped body and two arms extending from opposite ends of the body. The clip engages with two protrusions of a socket on a printed circuit board to fasten the heat sink to an electronic component mounted in the socket. The body is made of metal material and a cost of the clip with the flake-shaped body is high.

Accordingly, what is needed is a heat dissipation assembly including a clip which is simple and cost-effective.

SUMMARY OF THE INVENTION

In accordance with an embodiment of the present invention, a clip for securing a heat dissipating device to a heat source comprises a spring arm and an ear. The spring arm comprises two wires substantially parallel to each other, a hook formed at one end of the spring arm to connect ends of the wires and two barbs each formed at another end of each of the wires. A central portion of each of the wires projects downwardly. The ear comprises a main body, two notches in an upside of the main body and a clamping unit at a downside of the main body. Each of the notches comprises from above to below an insertion slot, an elongated sliding slot and a retaining slot. The spring arm engages with the ear with the barbs extending into the insertion slots, and the wires are slideable downwardly along the sliding slots to be fixed in the retaining slots.

Other advantages and novel features of the present invention will become more apparent from the following detailed description of preferred embodiment when taken in conjunction with the accompanying drawings, in which:

DETAILED DESCRIPTION OF THE INVENTION

Figure 1:
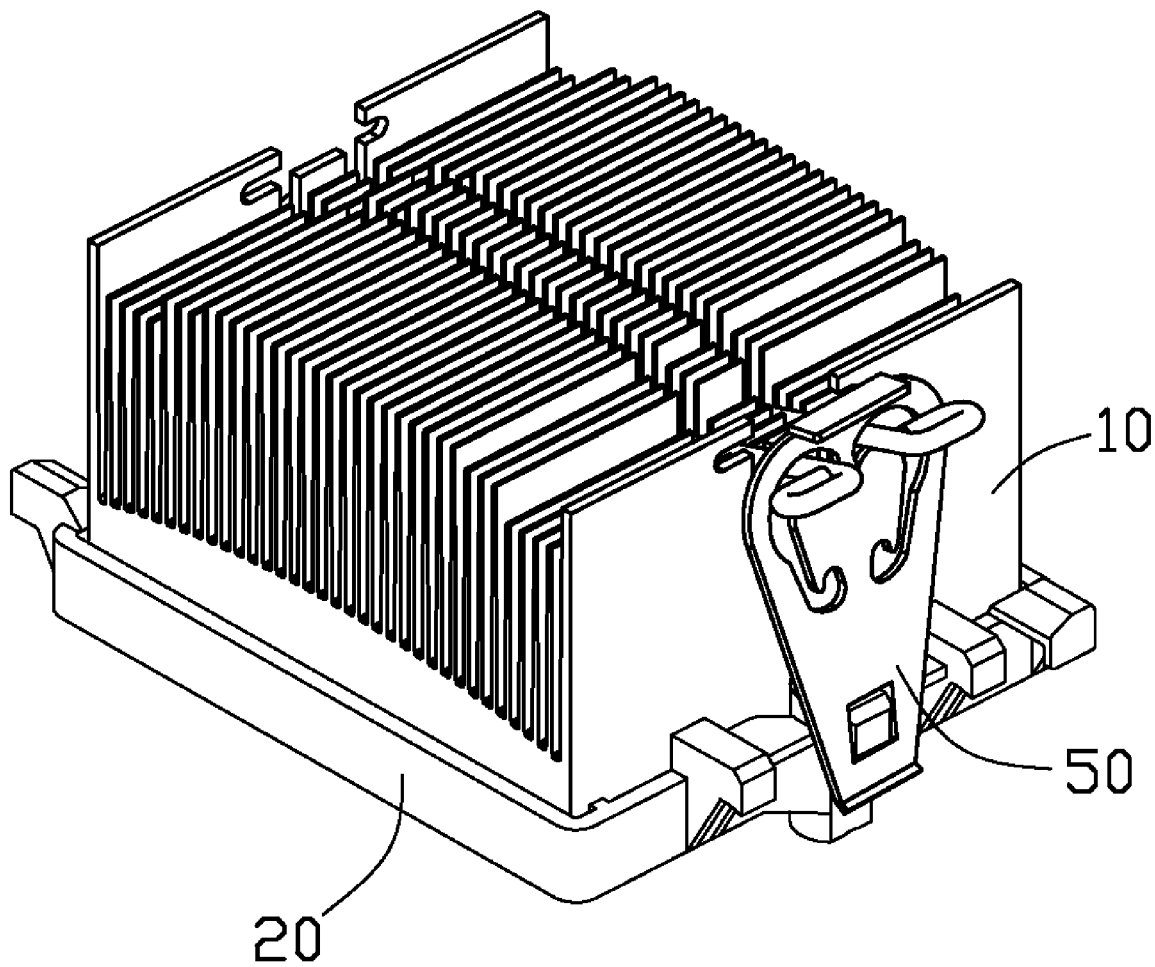
FIG. 1 is an assembled, isometric view of a heat dissipation assembly in accordance with a preferred embodiment of the present invention.

FIG. 1 illustrates a heat dissipation assembly in accordance with a preferred embodiment of the present invention. The heat dissipation assembly is used for dissipating heat from an electronic component (not shown) on a circuit board (not shown). The heat dissipation assembly comprises a heat sink 10, a mounting seat 20 for receiving the heat sink 10, and a clip 50 for fixing the heat sink 10 in the mounting seat 20 in such a manner that the heat sink 10 contacts the electronic component.

Figure 2:
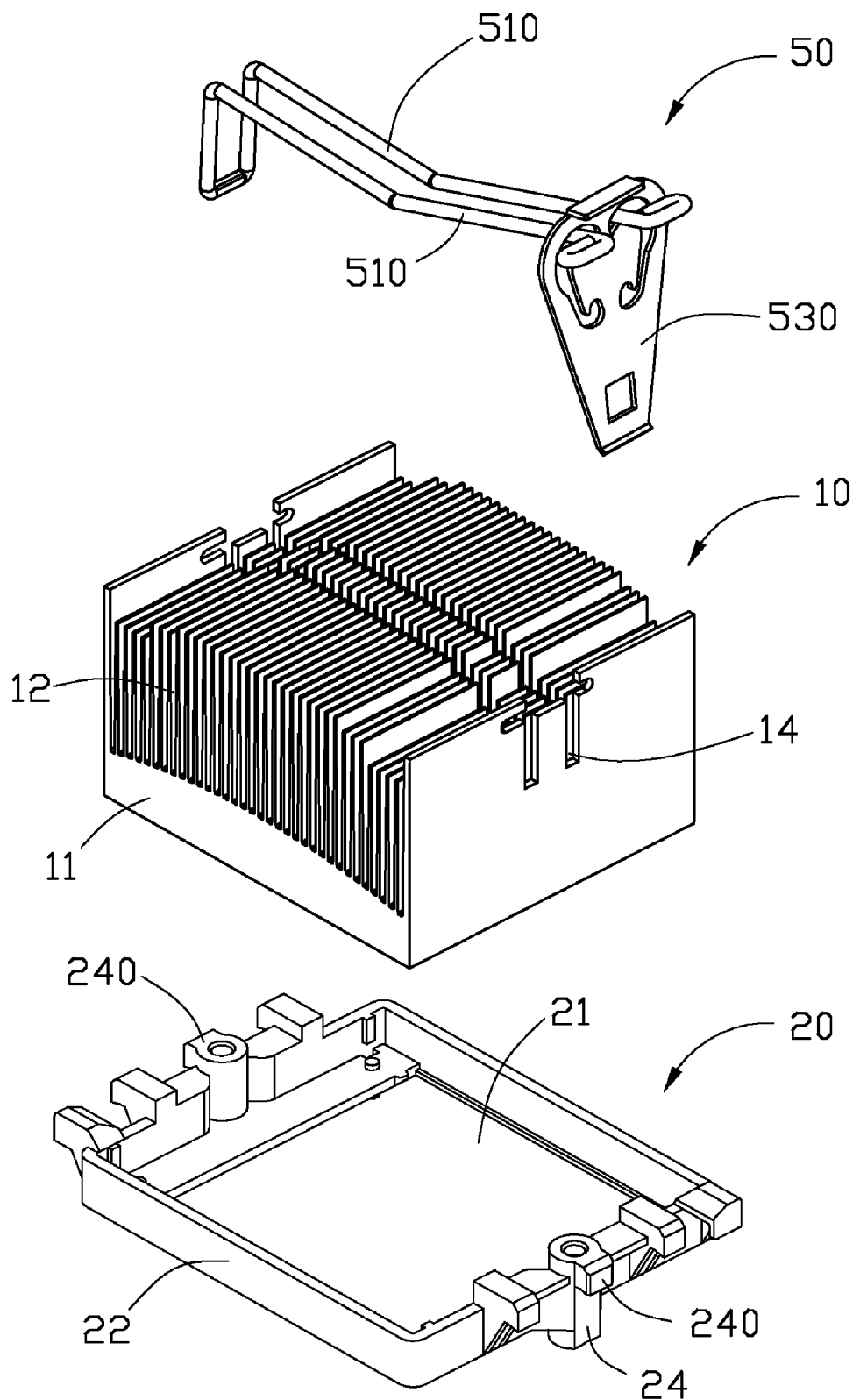
FIG. 2 is an exploded, isometric view of the heat dissipation assembly of FIG. 1.

Referring to FIG. 2, the mounting seat 20 is a rectangular frame, comprising four sidewalls 22 surrounding an opening 21 within which the electronic component is located. Two columns 24 are formed in a middle of two opposing sidewalls 22 of the mounting seat 20 and protrude vertically higher than the sidewalls 22. The mounting seat 20 is fixed to the circuit board by two screws (not shown) passing through the columns 24 and engaging with the circuit board. A protrusion 240 extends laterally outwardly from an outer side of either of the columns 24.

The heat sink 10 comprises a rectangular base 11 with a curving, top surface and a plurality of parallel fins 12 extending upwardly from the top surface of the base 11. Two outmost lateral fins 12 at opposite sides of the heat sink 10 are higher than the other fins 12. Two spaced receiving channels 14 are defined in a top portion of the fins 12 and extend through the fins 12 in a cross manner. The receiving channels 14 each have a depth into a middle position of the fins 12.

Figure 3:
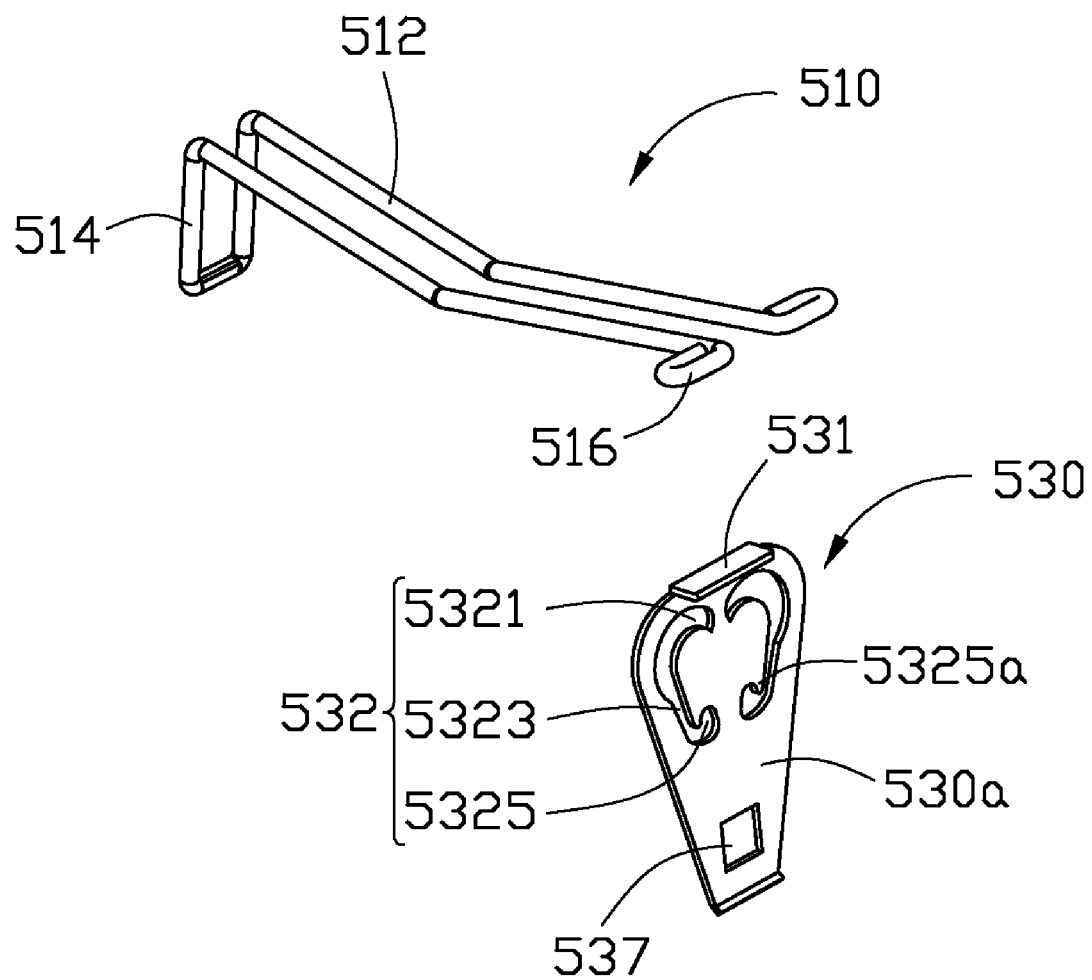
FIG. 3 is an exploded view of a clip of the heat dissipation assembly of FIG. 1.

The clip 50 is used to engage with the mounting seat 20 so as to make the heat sink 10 fastened within the opening 21 of the mounting seat 20 and ensure contact with the electronic component for dissipating heat therefrom. Referring to FIG. 3, the clip 50 comprises a spring arm 510 and a flake-shaped ear 530. The spring arm 510 is an integral, monolithic, one-piece construction and made by bending a piece of spring steel. The spring arm 510 comprises two linear, parallel, V-shaped wires 512. The wires 512 span in a longitudinal direction and are spaced from each other in a transverse direction. A middle portion of the wires 512 projects downwardly. One longitudinal end of the wires 512 forms a U-shaped hook 514 by curving down the end of the wires 512. At opposite end to the hook 514 of the wires 512, two barbs 516 are formed by horizontally bending free tips of the wires 512 respectively. The free ends of the wires 512 are bended outwardly and then folded back, thereby forming the barbs 516. Each of the barbs 516 is perpendicular to an extension of the corresponding wire 512 and cooperate with the wire 512 to form an L shape.

Figure 4:
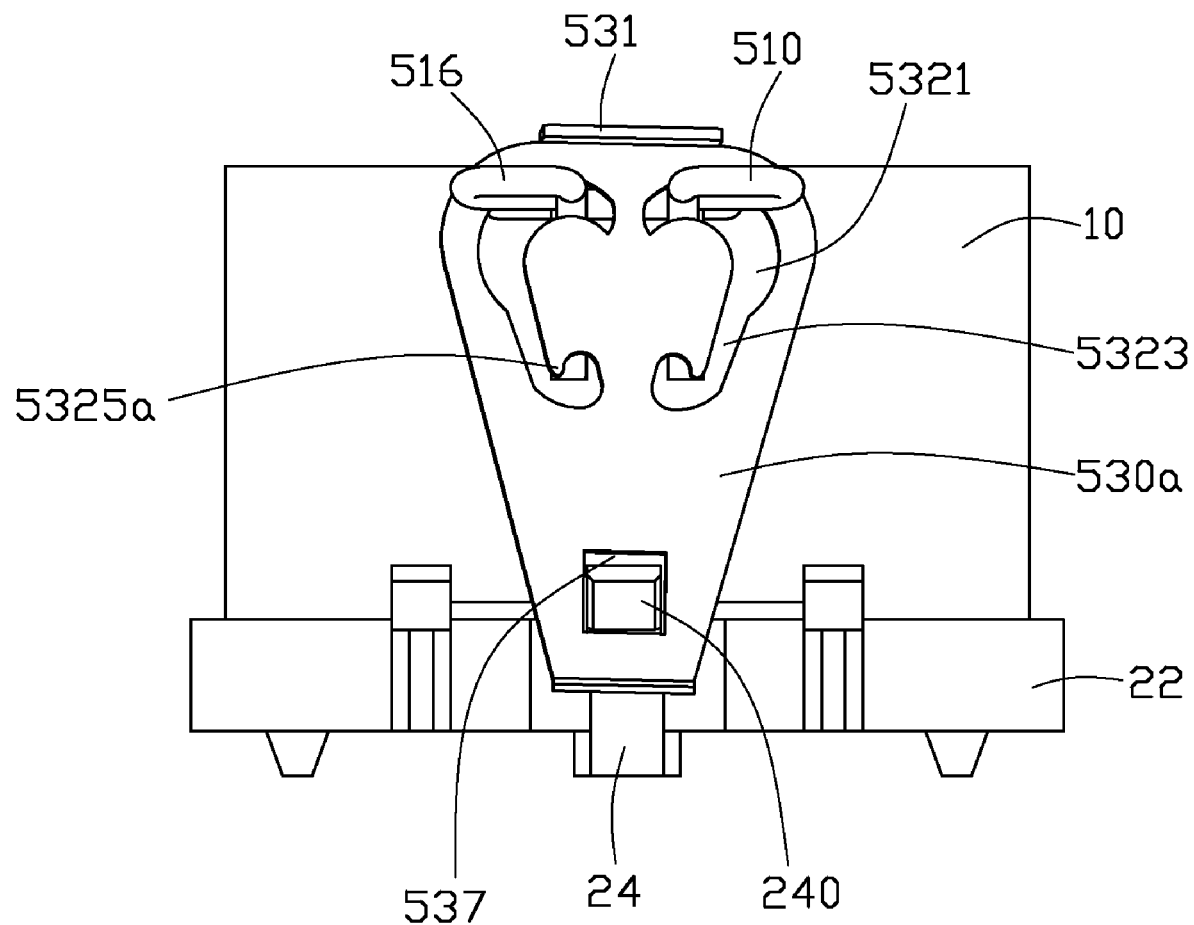
FIG. 4 is a side view of the heat dissipation assembly of FIG. 1, with the clip at an unlocked position.

The ear 530 can be made by a flake-shaped metal or plastic material and comprises a main body 530a, a handle 531 at a top of the main body 530a, two notches 532 in an upside of the main body 530a and a clamping hole 537 at a downside of the main body 530a. The handle 531 is a rectangular piece and extends to a lateral side of the ear 530 horizontally. A free end of the handle 531 is made to be thicker than other portion of the handle 531, which helps the operator to hold the ear 530. The two notches 532 are symmetrical and spaced from each other horizontally. Each of the notches 532 has a substantially C-shaped profile. Both of the notches 532 have curve-shaped contour lines. From above to below, each of the notches 532 comprises an insertion slot 5321, an elongated sliding slot 5323 and a retaining slot 5325. The insertion slot 5321 is adjacent to the handle 531. The insertion slot 5321 is constructed so that each of the barbs 516 can effectively extend through the corresponding insertion slot 5321. The sliding slot 5323 extends downwardly from the insertion slot 5321 and gets closer to a middle of the two notches 532. The sliding slot 5323 has a width slightly larger than a diameter of the wire 512. The retaining slot 5325 is located at a lower end of the sliding slot 5323. As shown in FIG. 4, a block portion 5325a protrudes downwardly from the main body 530a and is located between the sliding slot 5323 and the retaining slot 5325.

The clamping hole 537 is located adjacent to a bottom of the ear 530, corresponding to the protrusion 240 of the mounting seat 20. The clamping hole 537 has a slightly bigger size than that of the protrusion 240 and is used to receive the protrusion 240 of the mounting seat 20.

Referring to FIG. 4, in assembly, the mounting seat 20 is secured on the circuit board and the heat sink 10 is received in the opening 21 of the mounting seat 20. Each of the barbs 516 of the spring arm 510 is caused to extend into a corresponding insertion slots 5321 of the ear 530. The spring arm 510 spans across the fins 12 of the heat sink 10 with the wires 512 being received in the receiving channels 14 of the heat sink 10. The hook 514 of the spring arm 510 clamps the protrusion 240 of the corresponding side of the mounting seat 20. The clamping hole 537 loosely receives the protrusion 240 of the opposite side of the mounting seat 20.

Figure 5:
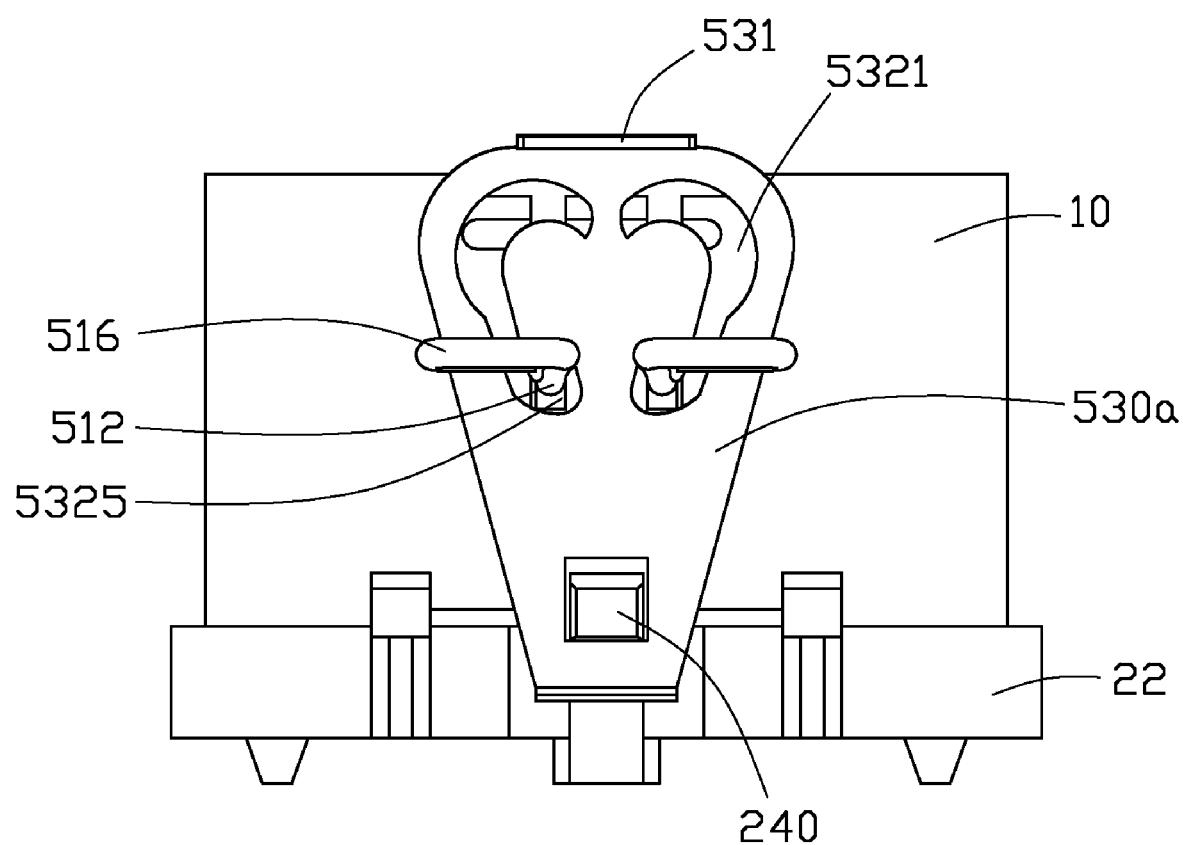
FIG. 5 is similar to FIG. 4, but showing the clip at a locked position.

Referring to FIG. 5, in order to firmly secure the heat sink 10, the handle 531 is held upwardly, and meanwhile each of the barbs 516 is pushed downwardly, causing the wires 512 sliding downwardly along the sliding slots 5323 until the barbs 516 enter into the retaining slots 5325. After the barbs 516 enter into the retaining slots 5325, the barbs 516 are released, and the wires 512 are received in the retaining slots 5325 and are prevented from disengaging from the retaining slots 5325 by the block portion 5325a. Thus, the wires 512 are elastically deformed and firmly abut against the heat sink 10 downwardly so that a bottom surface of the heat sink 10 intimately contacts with a top surface of the electronic component.

To unlock the clip 50 from the locked position of FIG. 5, the barbs 516 are pressed downwardly to cause the barbs 516 to get out of the retaining slots 5325. The wires 512 slide upwardly along the sliding slots 5323 and return to the insertion slots 5321, whereby the clip 50 can thereafter be detached from the heat sink 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for securing a heat dissipating device to a heat source, comprising:
   a spring arm comprising two wires substantially parallel to each other, a hook formed at one end of the spring arm to connect ends of the wires and two barbs each formed at another end of each of the wires, a central portion of each of the wires projecting downwardly; and
   an ear comprising a main body, two notches in an upside of the main body and a clamping unit at a downside of the main body, each of the notches comprising from above to below an insertion slot, an elongated sliding slot and a retaining slot;
   wherein a block portion extends from the main body of the ear into the notch and is located between the sliding slot and the retaining slot; and
   wherein the spring arm engages with the ear with the barbs extending into the insertion slots, and the wires are slideable downwardly along the sliding slots to be fixed in the retaining slots.

2. The clip as described in claim 1, wherein the spring arm is an integral, monolithic, one-piece construction and made by bending a piece of spring steel.

3. The clip as described in claim 1, wherein the wires of the spring arm are spaced from each other and each have a V-shaped profile.

4. The clip as described in claim 1, wherein the hook of the spring arm is U-shaped.

5. The clip as described in claim 1, wherein each of the barbs of the spring arm is formed by bending a free tip of a corresponding wire and cooperates with the corresponding wire to form an L shape.

6. The clip as described in claim 1, wherein the ear is flake-shaped, and the notches of the ear have curve-shaped contour lines and are symmetrically spaced from each other.

7. The clip as described in claim 1, wherein each notch has a C-shaped contour line.

8. A heat dissipation assembly comprising:
   a heat sink;
   a mounting seat comprising a frame and two engaging units formed at two opposite sides of the frame; and
   a clip comprising a spring arm and an ear, the spring arm comprising two wires, a hook formed at one end of the spring arm to connect ends of the wires and two barbs each formed at another end of each of the wires, a central portion of each of the wires projecting downwardly, the ear comprising a main body, two notches in an upside of the main body and a clamping unit at a downside of the main body, each of the notches comprising from above to below an insertion slot, an elongated sliding slot and a retaining slot;
   wherein a block portion extends from the main body of the ear into the notch and is located between the sliding slot and the retaining slot; and
   wherein the heat sink is received in the frame, the spring arm of the clip abuts against the heat sink, the hook of the spring arm engages with one of the engaging units of the frame, the clamping unit of the ear engages with the other one of the two engaging units, the spring arm engages with the ear with the barbs extending into the insertion slots, and the wires are slideable downwardly along the sliding slots to be fixed in the retaining slots to cause the wires to exert a downward force on the heat sink towards the mounting seat.

9. The heat dissipation assembly as described in claim 8, wherein the spring arm of the clip is an integral, monolithic, one-piece construction and made by bending a piece of spring steel.

10. The heat dissipation assembly as described in claim 9, wherein the wires of the spring arm each are V-shaped.

11. The heat dissipation assembly as described in claim 9, wherein each of the barbs of the spring arm is formed by bending a free tip of a corresponding wire and cooperates with the corresponding wire to form an L shape.

12. The heat dissipation assembly as described in claim 9, wherein the ear is flake-shaped, and the notches of the ear have curve-shaped contour lines and are symmetrically spaced from each other.

13. The heat dissipation assembly as described in claim 8, wherein the heat sink includes a plurality of fins and defines two receiving channels in a top portion of the fins, the wires being received in the receiving channels respectively.

14. The heat dissipation assembly as described in claim 8, wherein the engaging units are protrusions laterally formed on the frame of the mounting seat, and the clamping unit is a clamping hole defined in the main body of the ear.

15. A heat dissipation assembly for dissipating heat from a heat-generating component, comprising:

a heat sink; and a clip attached to the heat sink adapted for mounting the heat sink to the heat-generating component, the clip including:

a spring arm comprising at least one linear wire attached to the heat sink and a locking unit formed at a first end of the at least one linear wire; and an ear attached to a second end of the least one linear wire and defined with at least one notch therein, the at least one notch including an insertion slot and a retaining slot respectively at top and bottom ends of the at least one notch, and a sliding slot between the insertion slot and the retaining slot, said second end of the least one linear wire inserted into the insertion slot and moveable downwardly from the insertion slot along the sliding slot to be fixed in the retaining slot;

wherein the car has a block portion extending into the at least one notch at a position between the sliding slot and the retaining slot.

16. The heat dissipation assembly as described in claim 15, wherein the at least one notch has a substantially C-shaped profile.

17. The heat dissipation assembly as described in claim 15, wherein the spring arm has an integral, monolithic structure and includes two linear wires parallel to each other, the locking unit having a U-shaped profile and connecting the first ends of the two linear wires together, and the ear having two notches defined therein corresponding to the two linear wires.

* * * * *